United States Patent
Sun et al.

(10) Patent No.: US 7,858,493 B2
(45) Date of Patent: Dec. 28, 2010

(54) CLEAVING EDGE-EMITTING LASERS FROM A WAFER CELL

(75) Inventors: Weizhong Sun, Fremont, CA (US); Tsurugi Sudo, San Jose, CA (US); Jing Chai, Fremont, CA (US)

(73) Assignee: Finisar Corporation, Sunnyvale, CA (US)

( * ) Notice: Subject to any disclaimer, the term of this patent is extended or adjusted under 35 U.S.C. 154(b) by 422 days.

(21) Appl. No.: 12/036,157

(22) Filed: Feb. 22, 2008

(65) Prior Publication Data

US 2008/0206913 A1    Aug. 28, 2008

Related U.S. Application Data

(60) Provisional application No. 60/891,458, filed on Feb. 23, 2007.

(51) Int. Cl.
*H01L 21/46* (2006.01)

(52) U.S. Cl. .................. 438/455; 438/456; 438/457; 438/458; 438/459; 438/460; 438/461; 438/462; 438/463; 438/113; 438/114; 438/120

(58) Field of Classification Search .......... 438/455–463
See application file for complete search history.

(56) References Cited

U.S. PATENT DOCUMENTS

| | | | | |
|---|---|---|---|---|
| 4,814,296 A * | 3/1989 | Jedlicka et al. | ............... | 438/68 |
| 5,098,501 A * | 3/1992 | Nishiguchi | ............... | 156/275.5 |
| 5,284,792 A * | 2/1994 | Forster et al. | ................. | 438/29 |
| 5,393,929 A * | 2/1995 | Yagihashi | ..................... | 174/36 |
| 5,400,419 A * | 3/1995 | Heinen | ........................ | 385/14 |
| 5,510,273 A * | 4/1996 | Quinn | ........................ | 156/160 |
| 5,904,548 A * | 5/1999 | Orcutt | ........................ | 438/462 |
| 6,025,251 A * | 2/2000 | Jakowetz et al. | ............ | 438/464 |
| 6,156,584 A * | 12/2000 | Itoh et al. | ..................... | 438/33 |
| 6,392,143 B1 * | 5/2002 | Koshio | ........................ | 174/528 |
| 6,518,079 B2 * | 2/2003 | Imler | ........................ | 438/33 |
| 6,613,610 B2 * | 9/2003 | Iwafuchi et al. | ............. | 438/128 |
| 6,645,338 B1 * | 11/2003 | Sangani et al. | .............. | 156/289 |
| 6,752,888 B2 * | 6/2004 | Hosier et al. | ................. | 156/160 |
| 6,790,695 B2 * | 9/2004 | Ogihara et al. | ................ | 438/33 |
| 6,806,544 B2 * | 10/2004 | Liu | ............................ | 257/414 |
| 6,890,836 B2 * | 5/2005 | Howard et al. | ............. | 438/460 |
| 7,022,418 B2 * | 4/2006 | Connell et al. | ............. | 428/621 |
| 7,090,325 B2 * | 8/2006 | Hashimoto et al. | ............ | 347/20 |
| 7,141,443 B2 * | 11/2006 | Nagai et al. | ................... | 438/33 |
| 7,183,136 B2 * | 2/2007 | Hashimura et al. | .......... | 438/113 |
| 7,285,437 B2 * | 10/2007 | Silverbrook | ................. | 438/51 |
| 7,291,509 B2 * | 11/2007 | Hahn et al. | .................... | 438/33 |
| 7,371,594 B2 * | 5/2008 | Seo et al. | ....................... | 438/28 |
| 7,399,682 B2 * | 7/2008 | Yoshikawa et al. | .......... | 438/463 |
| 7,544,586 B2 * | 6/2009 | Ghyselen et al. | ............ | 438/460 |
| 7,572,657 B2 * | 8/2009 | Yakushiji | ..................... | 438/33 |

(Continued)

*Primary Examiner*—Fernando L Toledo
*Assistant Examiner*—Ankush K Singal
(74) *Attorney, Agent, or Firm*—Workman Nydegger

(57) ABSTRACT

In one example embodiment, a process for cleaving a wafer cell includes several acts. First a wafer cell is affixed to an adhesive film. Next, the adhesive film is stretched substantially uniformly. Then, the adhesive film is further stretched in a direction that is substantially orthogonal to a predetermined reference direction. Next, the wafer cell is scribed to form a notch that is oriented substantially parallel to the predetermined reference direction. Finally, the wafer cell is cleaved at a location substantially along the notch.

13 Claims, 9 Drawing Sheets

U.S. PATENT DOCUMENTS

| | | | |
|---|---|---|---|
| 7,713,844 B2* | 5/2010 | Nishiura et al. | 438/462 |
| 2001/0029064 A1* | 10/2001 | Odajima et al. | 438/113 |
| 2002/0197826 A1* | 12/2002 | Kim et al. | 438/460 |
| 2003/0013217 A1* | 1/2003 | Dudoff et al. | 438/27 |
| 2003/0161371 A1* | 8/2003 | Althaus et al. | 372/50 |
| 2003/0226830 A1* | 12/2003 | Liu et al. | 219/121.68 |
| 2004/0021214 A1* | 2/2004 | Badehi et al. | 257/690 |
| 2004/0029362 A1* | 2/2004 | Liu | 438/460 |
| 2004/0152285 A1* | 8/2004 | Konnemann | 438/460 |
| 2004/0191942 A1* | 9/2004 | Kawakami et al. | 438/33 |
| 2005/0042784 A1* | 2/2005 | Yanagisawa et al. | 438/28 |
| 2005/0064683 A1* | 3/2005 | Farnworth et al. | 438/464 |
| 2005/0070095 A1* | 3/2005 | Sharan et al. | 438/642 |
| 2005/0141577 A1* | 6/2005 | Ueta et al. | 372/43 |
| 2005/0208736 A1* | 9/2005 | Matsumura et al. | 438/460 |
| 2005/0255675 A1* | 11/2005 | Farnworth et al. | 438/460 |
| 2005/0282359 A1* | 12/2005 | Nagai et al. | 438/459 |
| 2006/0022289 A1* | 2/2006 | Badhei et al. | 257/432 |
| 2006/0084241 A1* | 4/2006 | Chin et al. | 438/460 |
| 2006/0169680 A1* | 8/2006 | Park | 219/121.68 |
| 2007/0108579 A1* | 5/2007 | Bolken et al. | 257/680 |
| 2007/0111478 A1* | 5/2007 | Komura et al. | 438/462 |
| 2007/0155131 A1* | 7/2007 | Contes | 438/458 |

* cited by examiner

CLEAVING EDGE-EMITTING LASERS FROM A WAFER CELL

CROSS-REFERENCE TO A RELATED APPLICATION

The present application claims priority from U.S. Provisional Patent Application Ser. No. 60/891,458, filed Feb. 23, 2007 and entitled "Cleaving Edge-Emitting Lasers from a Wafer Cell," which is incorporated herein by reference in its entirety.

BACKGROUND

Semiconductor edge-emitting lasers are currently used in a variety of technologies and applications, including communications networks. Generally, edge-emitting lasers produce a stream of coherent, monochromatic light by stimulating photon emission from a solid-state material. Example edge-emitting lasers commonly used as optical transmitters include Fabry-Perot ("FP") lasers and distributed feedback ("DFB") lasers. Edge-emitting lasers can be employed as optical transmitters to convert electrical signals into optical signals for transmission via an optical communication network.

As part of the manufacturing process of edge-emitting lasers, multiple edge-emitting laser diodes are generally formed on a single wafer. After the wafer processing is completed, individual rectangularly shaped edge-emitting lasers must be separated from the wafer. Individual edge-emitting lasers can be separated from the wafer by mechanically scribing the wafer with a precision instrument and then cleaving the wafer at each scribe location using a cleaving blade.

One cleaved side of each rectangularly shaped edge-emitting laser generally serves as the output facet. The output facet is the surface of the edge-emitting laser from which the light produced by the laser is emitted. In order to achieve reliable laser emissions, the output facet of an edge-emitting laser must be substantially free from damage and contamination after the cleaving process.

One common defect in edge-emitting laser output facets is metallic contamination. Metallic contamination occurs when a portion of a top metallic contact layer of an edge-emitting laser, composed of gold for example, is inadvertently deposited on the output facet of the laser or one or more adjacent lasers during the cleaving process. Examples of ridge waveguide ("RWG") edge-emitting lasers 50 with gold contamination 52 on an output facet 54 are shown in FIGS. 1A-1D.

Other common defects in edge-emitting laser output facets are microstep defects. Microstep defects are mechanical defects in the output facet of an edge-emitting laser that are caused by excessive cleaving force being applied to the laser during the cleaving process. An example of a ridge waveguide edge-emitting laser 60 with a microstep defect 62 on an output facet 64 is shown in FIG. 2.

Current processes for cleaving edge-emitting lasers often result in a high percentage of unusable lasers due to defects, such as metallic contamination and microstep defects, in the facets of the lasers.

BRIEF SUMMARY OF SOME EXAMPLE EMBODIMENTS

In general, example embodiments of the invention relate to processes for cleaving edge-emitting lasers from a wafer cell upon which the edge-emitting lasers are formed. In some example embodiments, the processes may result in an improved yield of edge-emitting lasers due to a decrease in the number of the edge-emitting lasers with facet defects.

In one example embodiment, a process for cleaving a wafer cell includes several acts. First a wafer cell is affixed to an adhesive film. Next, the adhesive film is stretched substantially uniformly. Then, the adhesive film is further stretched in a direction that is substantially orthogonal to a predetermined reference direction. Next, the wafer cell is scribed to form a notch that is oriented substantially parallel to the predetermined reference direction. Finally, the wafer cell is cleaved at a location substantially along the notch.

In another example embodiment, a process for cleaving lasers includes several acts. First, a wafer cell comprising two or more lasers is affixed to an adhesive film. Next, the adhesive film is stretched substantially uniformly. Then, the adhesive film is further stretched in a direction that is substantially orthogonal to a predetermined notch orientation. Next, the wafer cell is scribed to form a notch that is oriented substantially parallel to the predetermined notch orientation. Finally, the wafer cell is cleaved at a location substantially along the notch such that two or more of the lasers are separated from each other.

In yet another example embodiment, a process for cleaving edge-emitting lasers includes several acts. First, a wafer cell comprising two or more edge-emitting lasers is affixed to an adhesive film having adhesion between about 90 g/25 mm and about 100 g/25 mm. Next, the adhesive film is stretched substantially uniformly with a tensile force between about 200 g and about 300 g being exerted on the adhesive film. Then, the adhesive film is further stretched in a direction that is substantially orthogonal to a predetermined notch orientation, with a tensile force between about 400 g and about 600 g being exerted on the adhesive film. Next, the wafer cell is scribed with a diamond tipped instrument to form a notch that is oriented substantially parallel to the predetermined notch orientation. Finally, the wafer cell is cleaved to a depth between about 30 μm and about 50 μm at a location substantially along the notch. The cleaving is performed with a cleaving blade exerting a force against the wafer cell for between about 80 microseconds and about 300 microseconds.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION OF SOME EXAMPLE EMBODIMENTS

Example embodiments of the present invention relate to processes for cleaving edge-emitting lasers from a wafer cell upon which the edge-emitting lasers are formed. In some example embodiments, the processes may result in an improved yield of edge-emitting lasers due to a decrease in the number of the edge-emitting lasers with facet defects.

1. Example Wafer

Figure 1A:
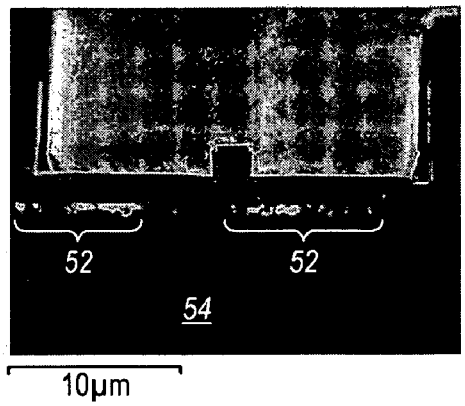
FIGS. 1A-1D disclose example ridge waveguide edge-emitting lasers with metallic contamination.
Figure 1B:
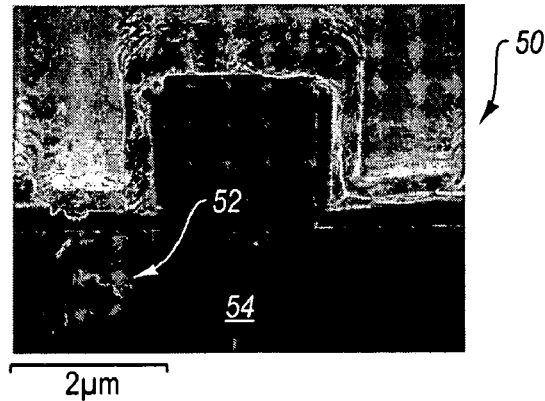
Figure 1C:
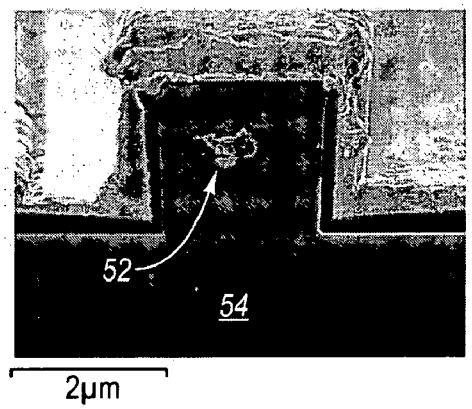
Figure 1D:
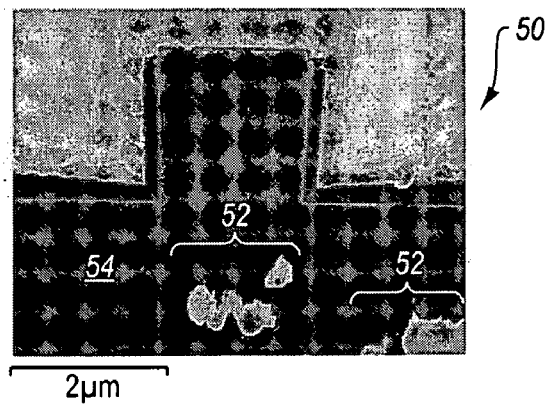
Figure 2:
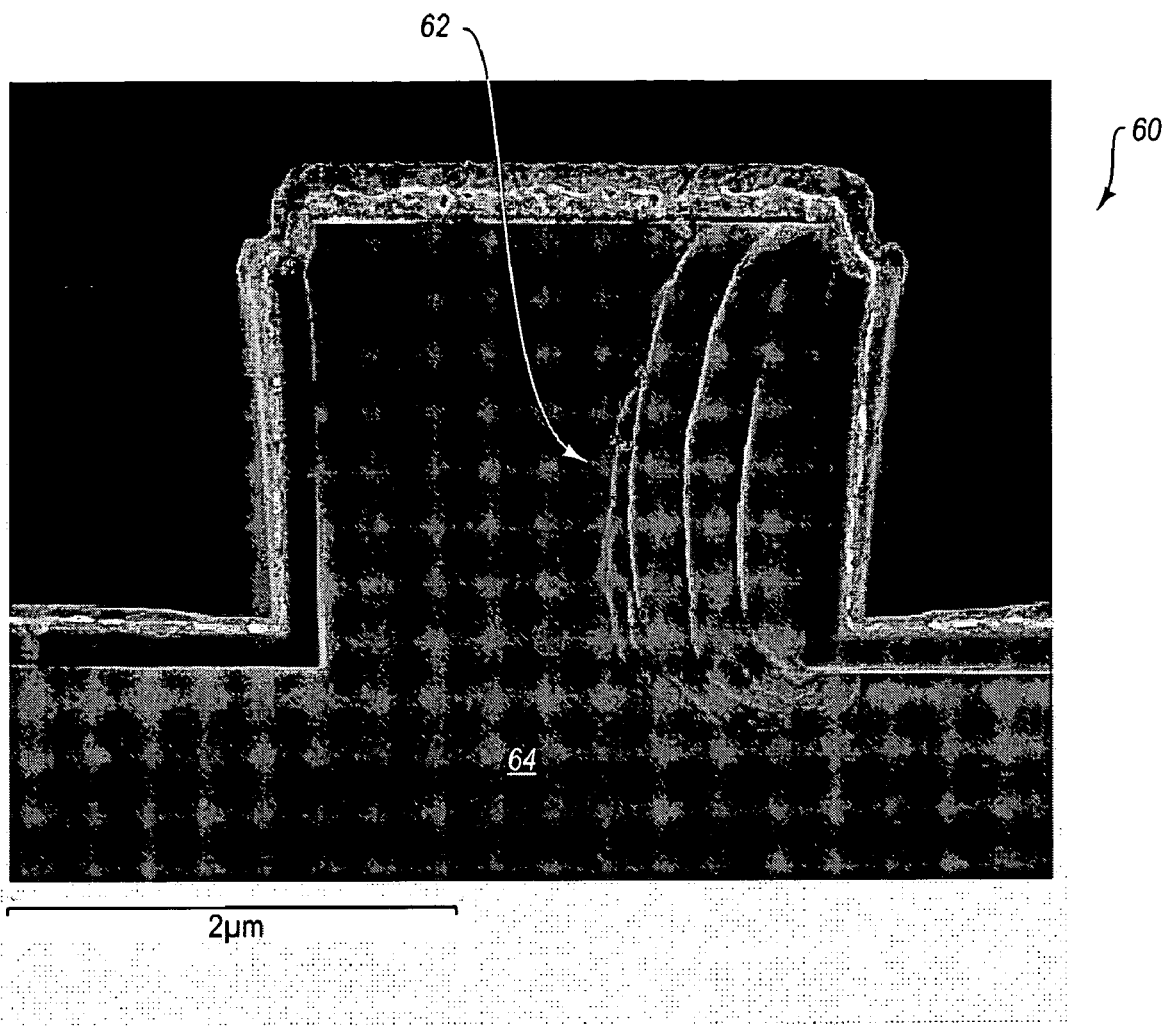
FIG. 2 discloses and example ridge waveguide edge-emitting laser with a microstep defect.
Figure 3:
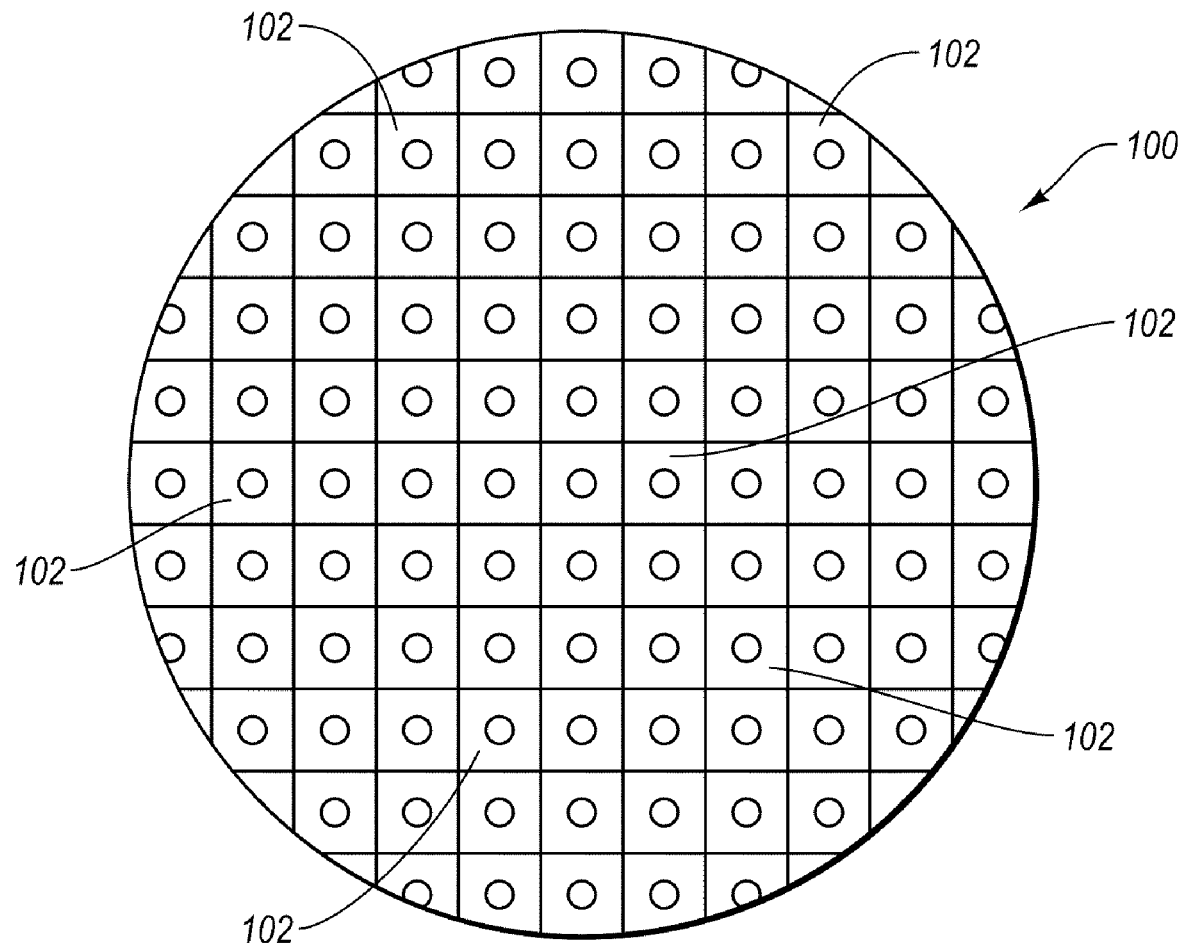
FIG. 3 is a top view of an example wafer.

Reference is made first to FIG. 3 which discloses an example wafer, denoted generally at 100. The wafer 100 is a thin slice of semiconducting material, such as a silicon crystal, upon which semiconductor laser diodes can be formed or grown using various methods such as doping, chemical etching, and/or deposition of various materials. For example, processes such as metal organic phase epitaxy (MOVPE) or metal-organic chemical vapor deposition (MOCVD) may be employed. Semiconductor lasers can be formed for example from Group III-V compounds and alloys. The example wafer 100 in particular has been fabricated to include multiple lasers 102.

Each of the lasers 102 can be a semiconductor edge-emitting laser. For example, each of the lasers 102 can be a Fabry-Perot ("FP") ridge waveguide laser or a distributed feedback ("DFB") ridge waveguide laser. It should be noted, however, that the principles of the present invention can be extended to other types of lasers, including other types of FP and DFB lasers, or any other type of semiconductor device that may benefit from the example cleaving processes disclosed herein. In one example embodiment, each of the lasers 102 can be a ridge waveguide laser with a gold or gold alloy contact layer on the top of the laser. The example processes disclosed herein may decrease the incidence of gold from the gold contact layer being inadvertently deposited on laser facets of the lasers 102 during facet cleaving. The example processes disclosed herein may also decrease the incidence of other contact layer materials from being inadvertently deposited on laser facets of the lasers 102 during facet cleaving.

2. Example Adhesive Film, Wafer Cell, and Cleaving Equipment

Figure 4:
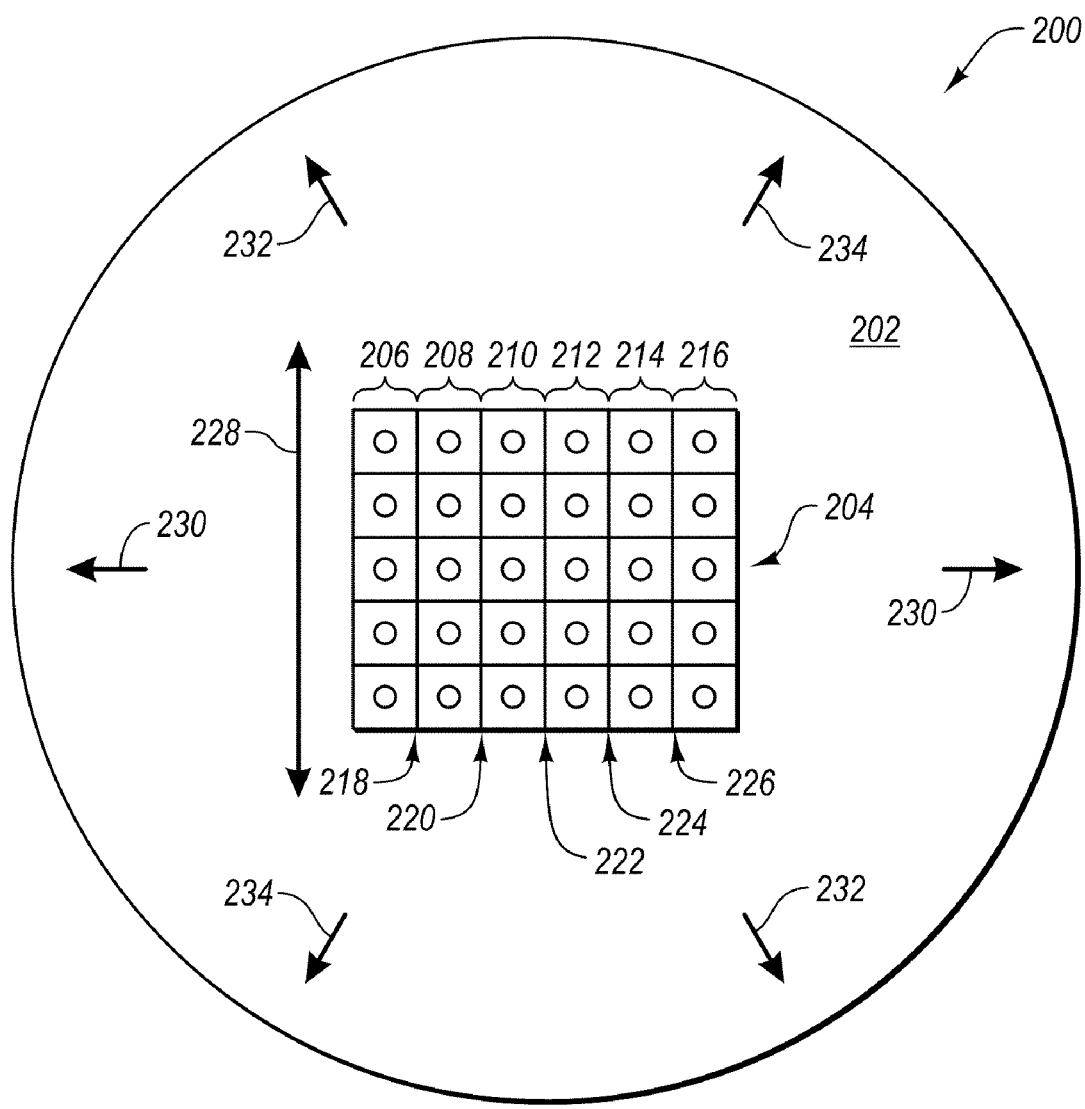
FIG. 4 is a top view of an example wafer cell affixed to an example adhesive film.

With continued reference to FIG. 3, and with reference now to FIG. 4, a top view of an example adhesive film is disclosed, denoted generally at 200. The adhesive film 200 includes an adhesive surface 202. FIG. 4 also discloses a wafer cell 204 affixed to the adhesive surface 202 of the adhesive film 200. The wafer cell 204 disclosed in FIG. 4 is a portion of the wafer 100 of FIG. 3.

The adhesive film 200 can be mounted to a frame, such as a metal ring frame (not shown), in order to allow the adhesive film 200 to support the wafer cell 204. As discussed in further detail below, the frame can be used to stretch the adhesive film 200. Various types of adhesive films are suitable for the example processes disclosed herein. For example, one suitable adhesive film is the Silicon-Free Adhesive Film (Part number 1008R) available from Ultron Systems, Inc. in Moorpark, Calif. Although the example adhesive film is generally circular, it is contemplated that the adhesive film may have any suitable shape or size for the example processes discussed in further detail below.

FIG. 4 also discloses regions of the wafer cell 204 that can be cleaved into bars 206-216 using one of the example cleaving processes described herein. As disclosed in FIG. 4, each of the bars 206-216 contains multiple lasers. It is noted that the number of lasers in each of the bars 206-216 can vary and is not limited to the number disclosed in FIG. 4. In particular, each of the bars 206-216 can include a fewer or greater number of lasers than disclosed in FIG. 4. Additionally, the number of bars cleaved from the wafer cell 204 can also vary and is not limited to the number disclosed in FIG. 4. The bars cleaved from the wafer cell 204 may or may not have the same number of lasers As part of the example cleaving processes disclosed herein, the wafer cell 204 is scribed to form notches 218-226 between the bars 206-216. Each of the notches 218-226 formed in a surface of the wafer cell 204 between the bars 206-216 is oriented substantially parallel to a predetermined notch orientation 228. It is noted that the predetermined notch orientation 228 is for example purposes only, and different predetermined notch orientations and orientations of notches relative to those predetermined notch orientations may alternatively be used. FIG. 4 also discloses that the adhesive film 200 can be stretched by application of the tensile forces represented by arrows 230-234. This stretching of the adhesive film 200 will be discussed in greater detail below in connection with FIG. 7. It is noted that the tensile forces 230-234 may be applied at different locations with various magnitudes and is not limited to the example locations and magnitudes disclosed in FIG. 4.

With continuing reference to FIG. 4, and with reference now to FIGS. 5A-5D and FIG. 6, additional aspects of the example adhesive film 200 and the wafer cell 204 are disclosed. In general, FIGS. 5A-5C disclose the wafer cell 204 and/or one or more of the bars 206-216 affixed to the adhesive surface 202 of the adhesive film 200.

Figure 5A:
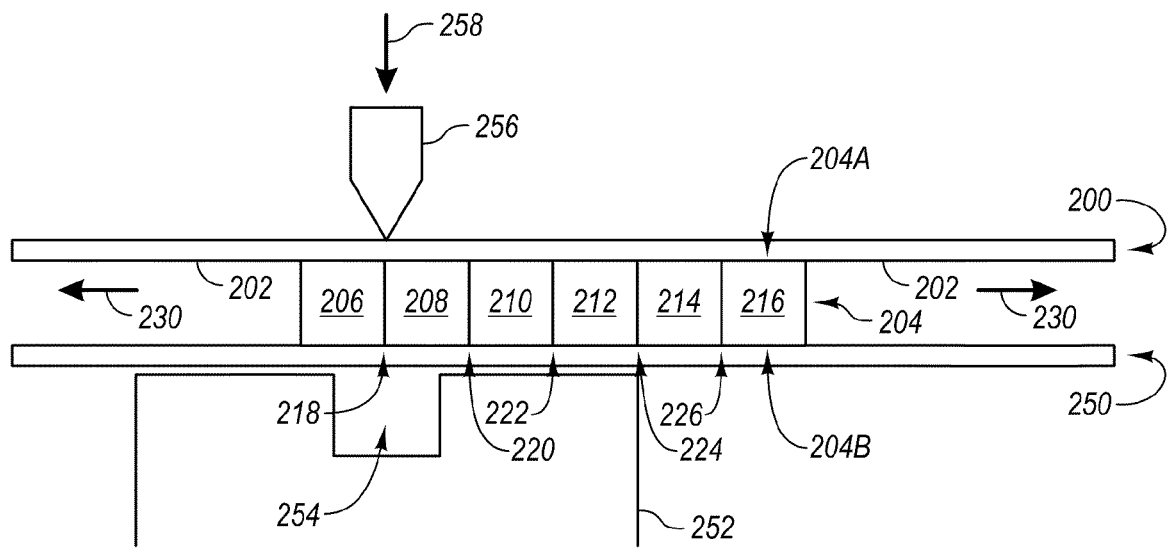
FIGS. 5A-5C are various side views of different stages of the example wafer cell of FIG. 4 being cleaved into example bars.
Figure 5B:
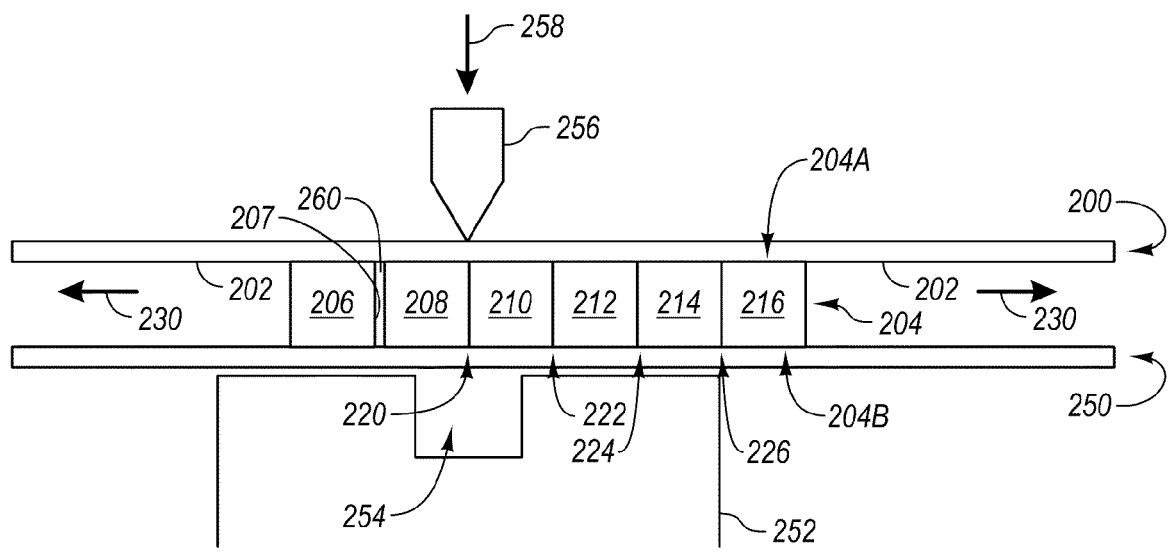
Figure 5C:
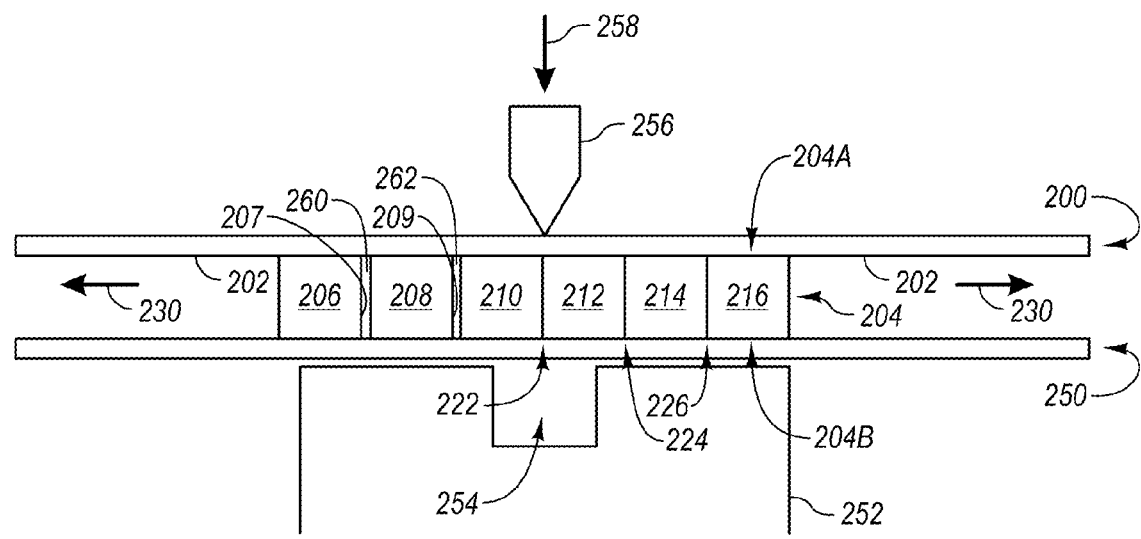

In contrast to the arrangement disclosed in FIG. 4 however, the adhesive film 200 has been turned upside-down in FIGS. 5A-5C so that the adhesive surface 202 is supporting the wafer cell 204 and/or one or more of the bars 206-216 beneath the adhesive film 200 instead of above the adhesive film 200. FIGS. 5A-5C also disclose a protective film 250 beneath the wafer cell 204, a receiver 252 having a cleaving cavity 254 beneath the protective film 250, and a cleaving blade 256 above the adhesive film 200. Unlike the adhesive film 200, the protective film 250 makes contact with the wafer cell 204 without adhering to the wafer cell 204. The protective film 250 can be made, for example, from polyester, from a polyester-like material, or from a material similar to the adhesive film 200.

Each of the protective film 250, receiver 252, and cleaving blade 256 is configured for use in the example processes for cleaving the wafer cell 204 disclosed herein. In one example embodiment, the adhesive film 200 is turned upside-down as shown in FIGS. 5A-5C so that the cleaving force 258 applied by the cleaving blade 256 can be exerted on the bottom side 204A of the wafer cell 204 so as to avoid damaging ridge waveguides that are formed on the top side 204B of the wafer cell 204.

FIGS. 5A-5C also disclose the adhesive film 200 stretched with a tensile force 230, and the cleaving blade 256 applying a cleaving force 258 against the bottom side 204A of the wafer cell 204. FIGS. 5B and 5C further disclose gaps 260 and 262 which can be created as a result of the tensile force 230 after the bars 204 and 206 have been cleaved using the example cleaving processes disclosed in greater detail below in connection with FIG. 7. As noted earlier, additional or alternative tensile forces may be applied to the adhesive film 200. As each bar is cleaved from the wafer cell 204, an output facet of the bar is exposed. For example, an output facet 207 of the bar 206 is exposed in FIG. 5B, and an output facet 209 of the bar 208 is exposed in FIG. 5C.

Figure 5D:
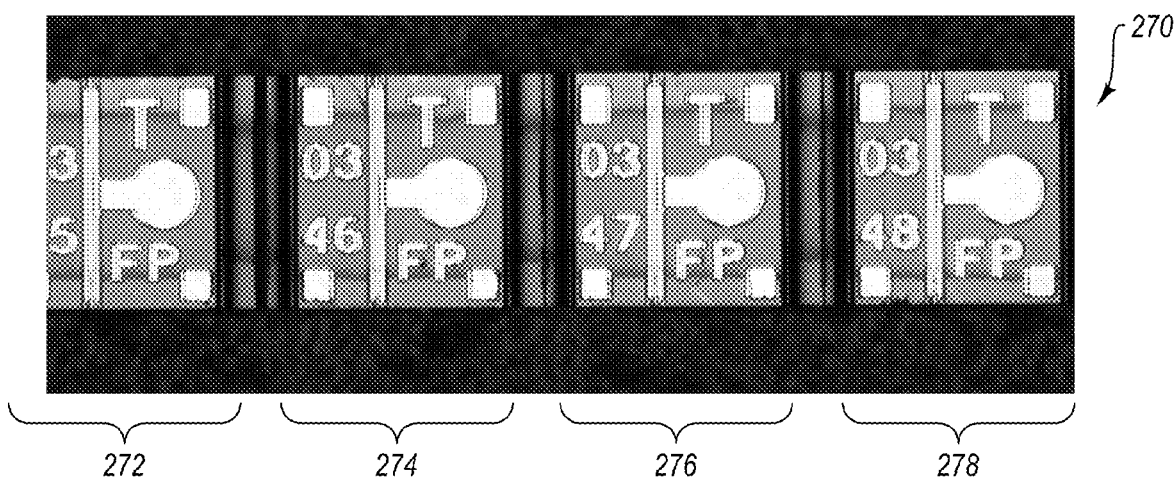
FIG. 5D is a top view of an example bar that has been cleaved from the example wafer cell similar to that disclosed in FIG. 4.

FIG. 5D is a top view of an example bar 270 that has been cleaved from a wafer cell such as the example wafer cell 204 of FIGS. 4 and 5A-5C. The example bar 270 includes several ridge waveguide edge-emitting lasers 272-278.

Figure 6:
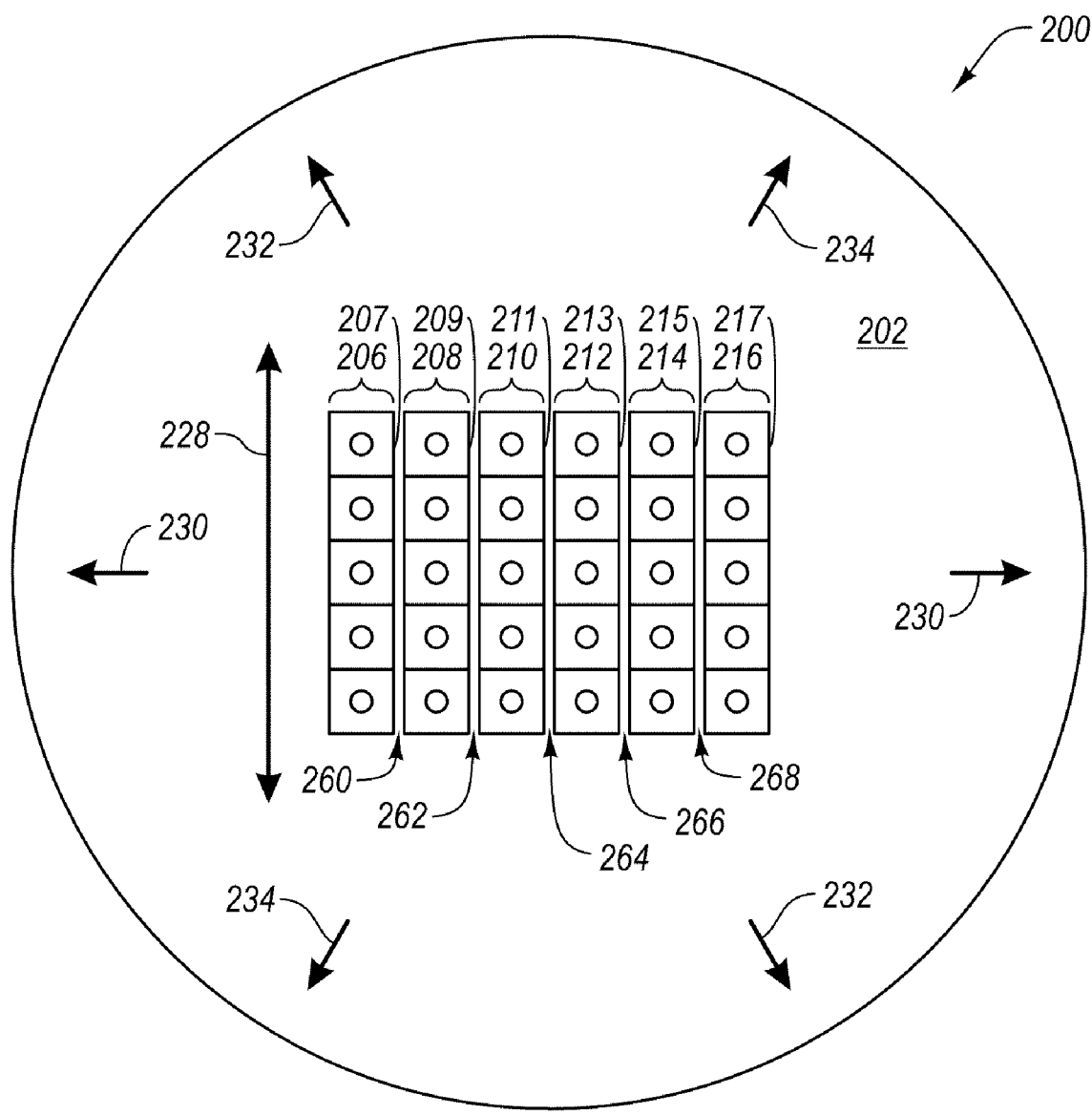
FIG. 6 is a top view of the example wafer cell of FIG. 4 after the wafer cell has been cleaved into example bars.

FIG. 6 discloses the adhesive film 200 after each of the bars 206-216 has been cleaved from the wafer cell 204. FIG. 6 also discloses gaps 264-268, in addition to the gaps 260 and 262 discussed above, which can be created as a result of the application of the tensile force 230 during cleaving processes such as those examples disclosed in greater detail below in connection with FIG. 7. FIG. 6 also discloses output facets 211-217, in addition to the output facets 207 and 209 discussed above, which can be exposed as a result of cleaving processes such as the example cleaving processes disclosed herein.

3. Example Process for Cleaving a Wafer Cell

Figure 7:
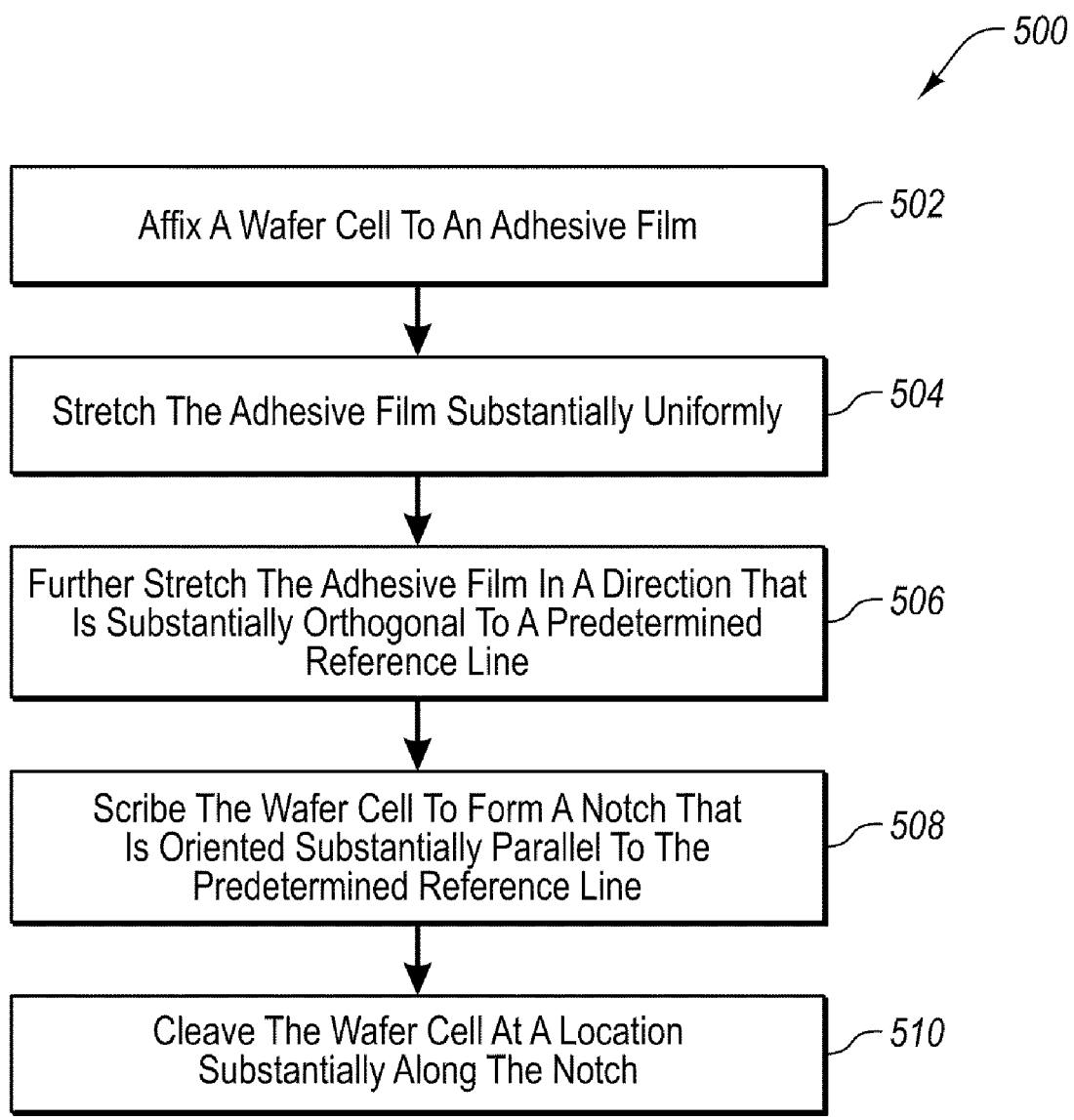
FIG. 7 discloses an example process for cleaving a wafer cell.

With reference now to FIG. 7, an example process for cleaving a wafer cell is disclosed, denoted generally at 500. The process 500 may result in an improved yield of edge-emitting lasers cleaved from the wafer cell due to a decrease in the number of edge-emitting lasers with facet defects, such as metallic contamination and microstep defects for example. The process 500 includes various acts, examples of which will be disclosed in connection with FIGS. 4, 5A-5C, and 6.

The process 500 includes an act 502 of affixing a wafer cell to an adhesive film. For example, the wafer cell 204 can be affixed to the adhesive surface 202 of the adhesive film 200, as disclosed in FIG. 4. The example adhesive film 200 can have various thicknesses and levels of adhesion. In one example embodiment, the adhesive film 200 has a thickness of about 80 μm and a level of adhesion between about 90 g/25 mm and about 100 g/25 mm, although other thicknesses and levels of adhesion are possible and contemplated.

The process 500 also includes an act 504 of stretching the adhesive film substantially uniformly. For example, the adhesive film 200 can be stretched substantially uniformly with tensile forces such as tensile forces 230-234 disclosed in FIG. 4. In this example, it is noted that the combined tensile forces 230-234 represent a substantially uniform distribution of tensile force applied to the adhesive film 200. It is also noted that the magnitude of the resulting tension in the adhesive film 200 may be affected by and/or dictated by various factors including, but not limited to, film material, temperature, and humidity. The tensile forces 230-234 can be applied, for example, using a ring-shaped metal frame (not shown) or any other type of frame or device capable of exerting a substantially uniform distribution of tensile force to the adhesive film 200. It is noted that a substantially uniform tensile force can be created by applying a tensile force at one or more locations, and it may not be necessary to have to opposing tensile force components to achieve a substantially uniform stretching of the adhesive film 200. In one example embodiment, a substantially uniform tensile force between about 200 g and about 300 g can be exerted on the adhesive film 200, although other magnitudes of substantially uniformly tensile force are possible and contemplated. A substantially uniform tensile force exerted on an adhesive film is a force that results in a substantially uniform stretching of the adhesive film.

The process 500 also includes an act 506 of further stretching the adhesive film in a direction that is substantially orthogonal to a predetermined reference direction. For example, the adhesive film 200 can be stretched with a tensile force 230 in a direction that is substantially orthogonal to the predetermined notch orientation 228. The predetermined notch orientation 228 may in some cases be substantially aligned with a crystal plane of the wafer cell 204.

The process 500 also includes an act 508 of scribing the wafer cell to form a notch that is oriented substantially parallel to the predetermined notch orientation 228. More generally, the wafer can be scribed or otherwise marked to produce a notch or other feature that is disposed in a desired orientation with respect to a reference feature such as a reference direction. For example, the wafer cell 204 can be scribed to form a notch 218 in a surface of the wafer cell 204 between the bars 206 and 208. This scribing can be accomplished using, for example, a diamond tipped instrument to form the notch 218 in a surface of the wafer cell 204. Notches, or other features, of various sizes, geometries, and locations can be formed in a surface of the wafer cell 204 between the bars 206-216. As noted herein in connection with the example of FIG. 4, each of the notches 218-226 formed in a surface of the wafer cell 204 is oriented substantially parallel to the predetermined notch orientation 228.

The process 500 also includes an act 510 of cleaving the wafer cell at a location substantially along the notch. For example, the cleaving blade 256 can be employed to cleave the wafer cell 204 at a location substantially along the notch 218. In this example, the "location substantially along the notch 218" is directly above the notch 218 on the bottom side 204A of the wafer cell 204, while the notch 218 is on the top side 204B of the wafer cell 204 (the vertical line in FIG. 5A between bars 206 and 208 is not the notch 218, as the notch 218 is actually located on the top side 204B of the wafer cell 204, though the sides of the wafer cell 204 could be notched in some embodiments).

As disclosed in FIG. 5A, the cleaving blade 256 can be applied against the adhesive film 200 at a location substantially along the notch 218 between the bars 206 and 208. In one example embodiment, the cleaving force 258 is applied by the cleaving blade 256 against the wafer cell 204 for between about 80 microseconds and about 300 microseconds with a cutting depth between about 30 μm and about 50 μm, although other application time periods and cutting depths are possible and contemplated. It is noted that the cleaving blade 256 in this example does not actually cut all the way through the wafer cell 204. Instead, the cleaving force 258 exerted by the cleaving blade 256 causes the wafer cell 204 to break along a crystal plane of the wafer cell 204. Although the cleaving force 258 exerted by the cleaving blade 256 is also exerted against the adhesive film 200 in this example, the elastic characteristics of the adhesive film 200 enable the adhesive film 200 to remain uncut by the cleaving blade 256 during the process 500.

In one example illustration of the act 510 disclosed in the progression from FIG. 5A to FIG. 5B, the cleaving force 258 of the cleaving blade 256 is applied against the wafer cell 204 at a location substantially along the notch 218, as disclosed in FIG. 5A. As a result, the bar 206 is cleaved from the wafer cell 204, as disclosed in FIG. 5B. After the bar 206 is cleaved from the wafer cell 204, the output facet 207 of the bar 206 is exposed and the elasticity of the adhesive film 200 and the tensile force 230 causes the bar 206 to separate from the wafer cell 204 resulting in a gap 260 between the output facet 207 of the bar 206 and the wafer cell 204.

In another example illustration of the act 510 disclosed in the progression from FIG. 5B and FIG. 5C, the cleaving force 258 of the cleaving blade 256 is applied against the wafer cell 204 at a location substantially along the notch 220, as disclosed in FIG. 5B. As a result, the bar 208 is cleaved from the wafer cell 204, as disclosed in FIG. 5C. After the bar 208 is cleaved from the wafer cell 204, the output facet 209 of the bar 208 is exposed and the tensile force 230 causes the bar 208 to separate from the wafer cell 204 resulting in a gap 262 between the output facet 209 of the bar 208 and the wafer cell 204. The gap 260 also continues to exist between the output facet 207 of the bar 206 and the bar 208. Where the wafer cell 204 includes ridge waveguide edge-emitting lasers, the example bars 206 and 208 may resemble the bar 270 disclosed in FIG. 5D.

As disclosed in FIG. 6, after each of the remaining bars 210-216 is cleaved from the wafer cell 204, the tensile force 230 results in gaps 264-268 between the bars 210-216. After each of the bars 206-216 is cleaved from the wafer cell 204, each bar can be loaded into a fixture and placed into a vacuum chamber for facet coating. The process of facet coating involves coating each of the facets with a reflective optical material. The reflective optical material acts as a mirror for one facet and as a partial mirror for a second facet that is located opposite the first facet.

In some example embodiments of the process 500, the tensile force 230 may allow the wafer cell 204 to be cleaved with a smaller cleaving force 258 than would otherwise be required without the tensile force 230. Adjustments to the cleaving force 258 may enable refined control of the occurrence of microstep defects in the output facets 207-217 of edge-emitting lasers included in the bars 206-216.

Figure 8:
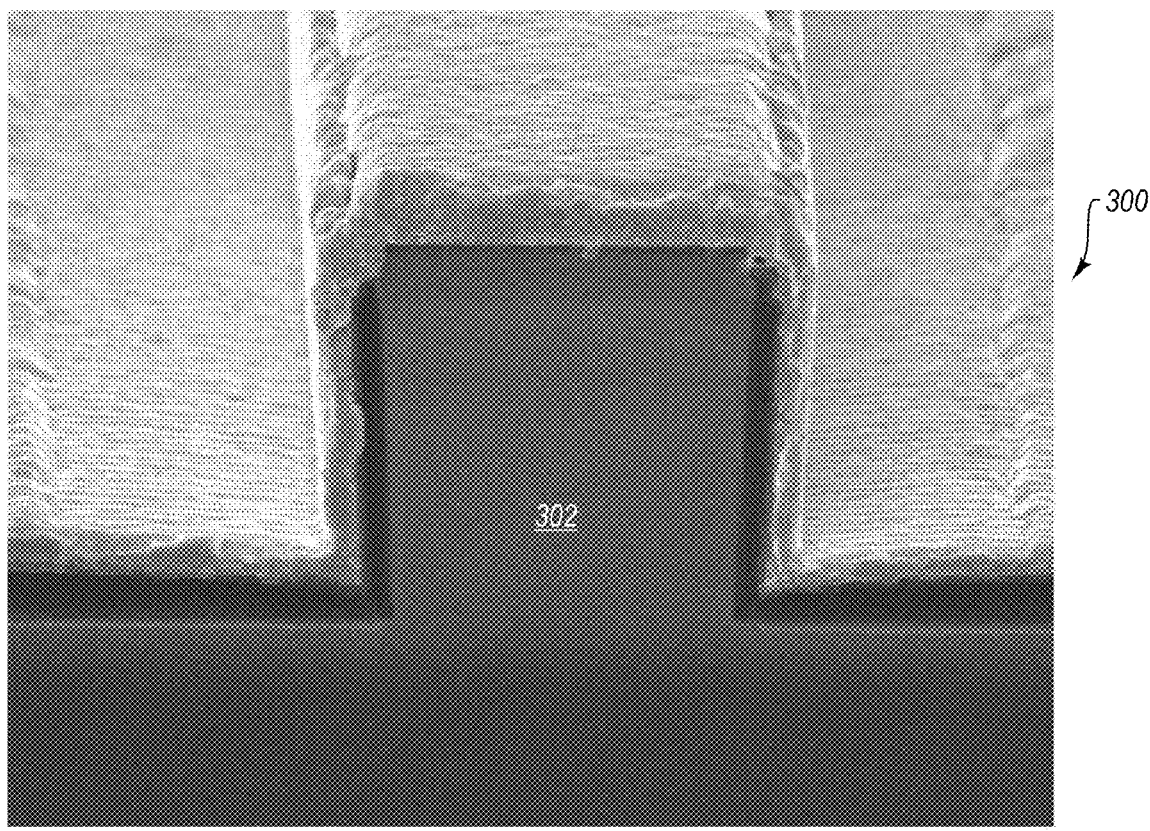
FIG. 8 discloses an example ridge waveguide edge-emitting laser produced using the example process of FIG. 7.

In addition, in some example embodiments, the tensile force 230, and the resulting gaps 260-268, may also prevent the bars 206-216 from inadvertently rubbing against each other or against the wafer cell 204 after each of the bars 206-216 is cleaved from the wafer cell 204. Preventing the bars 206-216 from rubbing against each other or against the wafer cell 204 may result in a decrease in metallic contamination, and other contact related defects, in the output facets 207-217 of edge-emitting lasers included in the bars 206-216. FIG. 8 discloses an example ridge waveguide edge-emitting laser 300 having an output facet 302 such as can be produced using the example process 500 of FIG. 7. In this example, the output facet 302 is substantially free of metallic contamination or microstep defects. A decrease in defects in the output facets 207-217 of the edge-emitting lasers of the bars 206-216 may result in an improved yield of edge-emitting lasers from the wafer cell 204.

The example embodiments disclosed herein are to be considered in all respects only as illustrative and not restrictive.

What is claimed is:

1. A process for cleaving lasers, the process comprising:
   affixing a wafer cell comprising two or more lasers to an adhesive film;
   stretching the adhesive film uniformly;
   further stretching the adhesive film in a direction that is orthogonal to a notch orientation;
   scribing the wafer cell to form a notch that is oriented parallel to the notch orientation; and
   cleaving the wafer cell at a location along the notch such that two or more of the lasers are separated from each other, wherein the adhesive film has a level of adhesion between about 90 g/25 mm and about 100 g/25 mm.

2. The process as recited in claim 1, wherein the adhesive film has a thickness of about 80 μm.

3. The process as recited in claim 1, wherein each of the lasers have facets at the cleaving location free from metallic contamination and microstep defects.

4. The process as recited in claim 1, wherein each of the lasers comprises a Fabry-Perot ridge waveguide laser or a distributed feedback ridge waveguide laser.

5. The process as recited in claim 1, wherein the notch orientation is aligned with a crystal plane of the wafer cell.

6. A process for cleaving lasers, the process comprising:
   affixing a wafer cell comprising two or more lasers to an adhesive film;
   stretching the adhesive film uniformly;
   further stretching the adhesive film in a direction that is orthogonal to a notch orientation;
   scribing the wafer cell to form a notch that is oriented parallel to the notch orientation; and
   cleaving the wafer cell at a location along the notch such that two or more of the lasers are separated from each other, wherein stretching the adhesive film uniformly comprises stretching the adhesive film uniformly with tensile forces between about 200 g and about 300 g being exerted on the adhesive film.

7. A process for cleaving lasers, the process comprising:
   affixing a wafer cell comprising two or more lasers to an adhesive film;
   stretching the adhesive film uniformly;
   further stretching the adhesive film in a direction that is orthogonal to a notch orientation;
   scribing the wafer cell to form a notch that is oriented parallel to the notch orientation; and
   cleaving the wafer cell at a location along the notch such that two or more of the lasers are separated from each other, wherein stretching the adhesive film in a direction that is orthogonal to the notch orientation comprises stretching the adhesive film in a direction that is orthogonal to the notch orientation with tensile forces between about 400 g and about 600 g being exerted on the adhesive film.

8. A process for cleaving edge-emitting lasers, the process comprising:
   affixing a wafer cell comprising two or more edge-emitting lasers to an adhesive film having adhesion between about 90 g/25 mm and about 100 g/25 mm;
   stretching the adhesive film uniformly with a tensile force between about 200 g and about 300 g being exerted on the adhesive film;
   further stretching the adhesive film in a direction that is orthogonal to a notch orientation, with a tensile force between about 400 g and about 600 g being exerted on the adhesive film;
   scribing the wafer cell with a diamond tipped instrument to form a notch that is oriented parallel to the notch orientation; and
   cleaving the wafer cell to a depth between about 30 μm and about 50 μm at a location along the notch, wherein the cleaving is performed with a cleaving blade exerting a force against the wafer cell for between about 80 microseconds and about 300 microseconds.

9. The process as recited in claim 8, wherein stretching the adhesive film uniformly is accomplished using a metal ring frame.

10. The process as recited in claim 8, wherein the adhesive film has a thickness of about 80 μm.

11. The process as recited in claim 8, wherein each of the lasers have facets at the cleaving location free from metallic contamination and microstep defects.

12. The process as recited in claim 8, wherein each of the edge-emitting lasers comprises a Fabry-Perot ridge waveguide laser or a distributed feedback ridge waveguide laser.

13. The process as recited in claim 8, wherein the notch orientation is aligned with a crystal plane of the wafer cell.

* * * * *